United States Patent [19]

Aotani et al.

[11] Patent Number: 5,084,902
[45] Date of Patent: Jan. 28, 1992

[54] JITTER CANCELLER WITH AN INITIAL VALUE SETTING CIRCUIT FOR AN ADAPTIVE FILTER

[75] Inventors: Yoshihisa Aotani; Masayuki Yamada, both of Tokyo; Kazushi Norimatsu, Shizuoka, all of Japan

[73] Assignee: NEC Corporation, Tokyo, Japan

[21] Appl. No.: 493,204

[22] Filed: Mar. 14, 1990

[30] Foreign Application Priority Data

Mar. 14, 1989 [JP] Japan .................................. 1-59796
Aug. 25, 1989 [JP] Japan .................................. 1-217434

[51] Int. Cl.$^5$ ............................................. H04L 7/00
[52] U.S. Cl. ......................................... 375/13; 375/118; 328/155
[58] Field of Search ................... 375/118, 119, 96, 39, 375/103, 15, 99, 27, 14, 13; 328/155; 329/304

[56] References Cited

U.S. PATENT DOCUMENTS 4,639,939 1/1987 Hirosaki et al. ...................... 375/118
4,926,499 5/1990 Kobayashi et al. ................... 375/118

*Primary Examiner*—Benedict V. Safourek
*Assistant Examiner*—Young Tse
*Attorney, Agent, or Firm*—Foley & Lardner

[57] ABSTRACT

A jitter canceller cancels time-variant signals in telephone lines resulting from 50 or 60 Hz commercial power sources which a phase locked loop will fail to absorb. The jitter canceller uses an adaptive filter having a tap coefficient which is not reset to "0" and forced to converge before a data transmission allowing use with telephone lines with multiple modems connected to a single line. The jitter canceller uses a phase rotating circuit, two phase difference detectors, and the adaptive filter to rotate the phase of an incoming signal by a phase predicted by the adaptive filter in order to cancel jittering.

4 Claims, 4 Drawing Sheets

JITTER CANCELLER WITH AN INITIAL VALUE SETTING CIRCUIT FOR AN ADAPTIVE FILTER

BACKGROUND OF THE INVENTION

The present invention relates to a data transmission system for transmitting data over telephone lines or other analog lines and, more particularly, to a jitter cancelling apparatus for carrier phase control associated with a receiver of such a data transmission system.

In a data transmission system, signals usually undergo various kinds of deterioration as typified by amplitude distortions, delay distortions, carrier frequency offsets and carrier phase jitters while being transmitted over lines. Among the various kinds of deterioration, amplitude distortions and delay distortions are almost time-invariant or, if time-variant, the variation is slow enough to allow such distortions to be compensated for by so-called automatic equalizers. Carrier phase jitters, on the other hand, result in time-variant distortions which have hitherto been absorbed by a phase locked loop or similar feed-back control system. However, since the carrier phase jitters develop in, for example, a carrier supply device of an analog transmission link and include periodic components approximating the ac (alternate current) cycle of 50 or 60 Hz of a commercial power source, the phase locked loop will fail to absorb the 60 Hz jitters under a baud rate of 2400 Hz unless the phase locked loop equivalent quality factor is limited to less than 40. Limiting the quality factor to less than 40 deteriorates the Gaussian noise suppression ability of the phase locked loop.

According to the prior art, such phase jitters are removed by, for instance, the jitter canceller disclosed in the U.S. Pat. No. 4,639,939. However, since the tap coefficient of the adaptive filter for use in the prior art jitter canceller is reset to "0" before a data transmission, it cannot cancel phase jitters until the filter coefficient reaches its optimum value. In a usual modem for use from point to point, because of the relatively large amount of data to be transmitted, the duration of no jitter suppression is shorter than the period during which jitters do undergo suppression, and accordingly the data transmission is not substantially affected. However, in a multi-point data transmission system in which a plurality of remote modems are connected to a single line and data are transmitted from these remote modems to a center modem, the amount of the data to be transmitted is so small that data transmission time is completed before the filter converges. As a result, a problem arises in that data are received with jitters totally failing to be suppressed, so that accurate data cannot be received.

SUMMARY OF THE INVENTION

An object of the present invention is to provide a jitter canceller which is cleared of the above disadvantage and whose adaptive filter can converge in a short period of time.

A jitter canceller according to the present invention has a phase rotating circuit which generates a phase-rotated signal by rotating an input baseband signal by a predicted phase. The phase-rotated received signal is discriminated by a decision circuit to give a discriminated digital symbol, which is supplied to first and second phase difference detectors. The first phase difference detector determines the phase difference between the input baseband signal and the discriminated signal to generate a first phase difference signal. Meanwhile, the second phase difference detector determines the phase difference between the phase-rotated signal and the discriminated signal to generate a second phase difference signal. An adaptive filter is responsive to the first and second phase difference signals for generating a predicted phase signal. The filter also has a coefficient setting circuit, which is responsive to a clear signal from an automatic equalizer in a modem, for setting filter coefficients of prescribed values before a data transmission. By setting the filter coefficients before a data transmission, the convergence of the filter can be accelerated.

DETAILED DESCRIPTION OF THE PREFERRED EMBODIMENT

Figure 1:
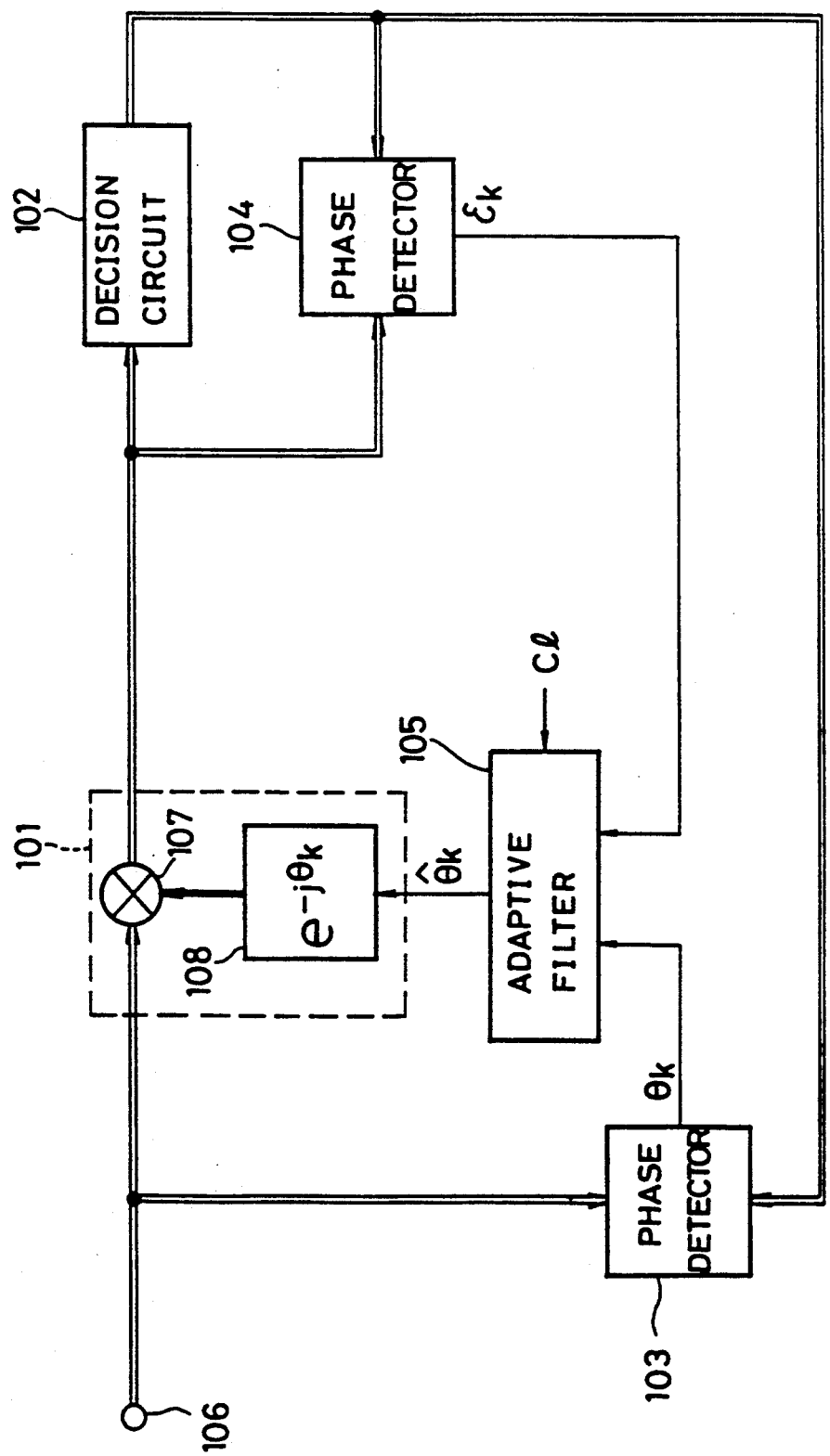
FIG. 1 is a block diagram showing a preferred embodiment of the present invention.

Referring to FIG. 1 of the drawings, a jitter canceller embodying the present invention is shown in a block diagram. The jitter canceller has an input terminal 106 to which a complex baseband signal is applied. A phase rotating circuit 101 generates a phase-rotated signal by rotating an input baseband signal by a predicted phase supplied from an adaptive FIR filter 105. The phase rotating circuit 101 comprises, as is well known to those skilled in the art, a multiplier 107 and a complex trigonometric function generator 108 for generating a complex signal $\exp(-j\theta_k)$ on the basis of a predicted phase $\theta_K$. A decision circuit 102 discriminates the phase-rotated signal, and supplies the discriminated data symbol to first and second phase difference detectors 103 and 104. The first phase difference detector 103 detects a first phase difference $\theta_K$ between the input baseband signal and the discriminated data symbol to generate a first phase difference signal. The second phase difference detector 104 detects a second phase difference $\epsilon_K$ between the phase-rotated signal and the discriminated data symbol to generate a second phase difference signal. The adaptive filter 105 generates the above-mentioned predicted phase in response to the first and second phase difference signals. The filter 105, as will be described below, has a circuit for setting a prescribed filter coefficient into the filter in response to an equalizer clear signal related to the training of an automatic equalizer which takes place in advance of a data transmission.

Figure 2:
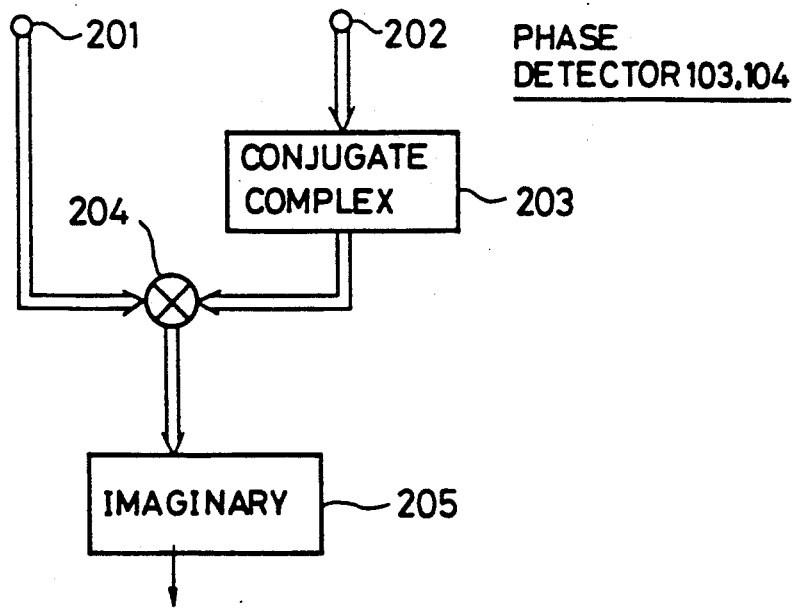
FIG. 2 is a block diagram showing an example of phase rotating circuit.

Referring to FIG. 2, a specific construction of the phase difference detector 103 or 104 is shown. As shown, the phase difference detector 103 (104) has a terminal 201 for receiving the phase-rotated signal from the phase rotating circuit 101, a terminal 202 for receiving the discriminated signal from the decision circuit 102, a complex conjugate unit 203 for producing a complex conjugate signal of the discriminated received signal, a multiplier 204 for producing a product of the first phase-rotated signal and the complex conjugate signal, and an imaginary part selector 205 for separating an imaginary part of the product.

Assuming that a discriminated symbol appearing on the terminal 201 is $$x = \gamma_e^{-j\theta} \quad \text{Eq. (1)}$$

and that a signal appearing on the terminal 202 is $$\hat{x} = \hat{\gamma}_e^{-j\hat{\theta}} \quad \text{Eq. (2)}$$

then the complex conjugate unit 203 modifies the Eq. (2) as $$\hat{x}^* = \hat{\gamma}_e^{-j\hat{\theta}} \quad \text{Eq. (3)}$$

After the multipler 204 has multiplied the signals represented by the Eqs. (1) and (3), the imaginary part selector 205 separates only an imaginary part y of the product. The imaginary part y is expressed as:

$$\begin{aligned} y &= Im[\gamma_e^{j\theta} \cdot \hat{\gamma}_e^{-j\hat{\theta}}] \\ &= Im[\gamma\hat{\gamma}_e^{j(\theta-\hat{\theta})}] \\ &= \gamma\hat{\gamma}\sin(\theta - \hat{\theta}) \\ &= C \sin(\theta - \hat{\theta}) \end{aligned} \quad \text{Eq. (4)}$$

assuming that $C = \gamma\hat{\gamma}$ and $\theta - \hat{\theta} < 1$.

Therefore, the output will be $y = \theta K$ if the phase difference is detected by the first detector 103, or $y = \epsilon_K$ if it is detected by the second detector 104.

Figure 3:
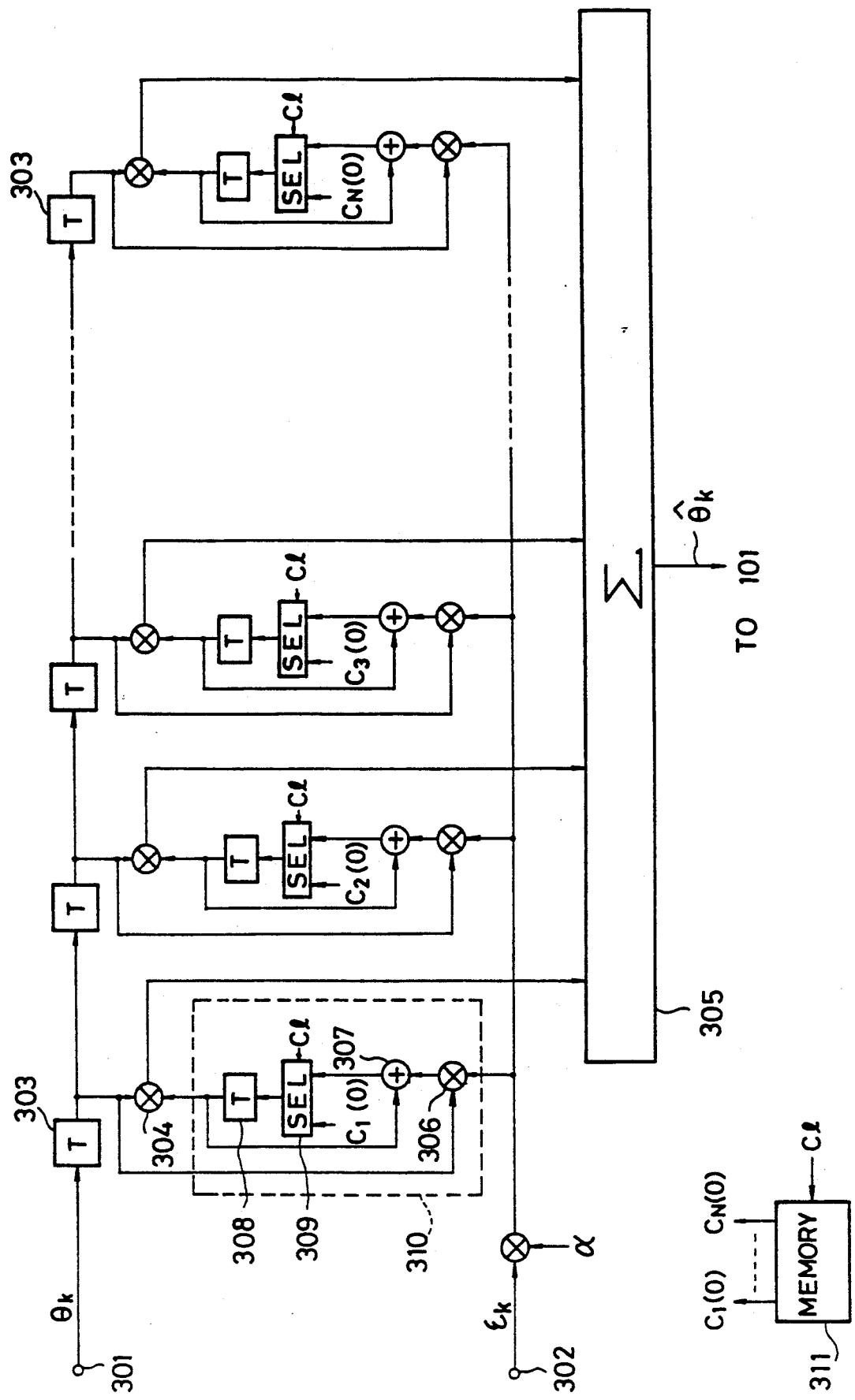
FIG. 3 is a block diagram showing an example of adaptive filter.

FIG. 3 is a block diagram showing an example of the adaptive filter 105. Referring to FIG. 3, the filter 105 has a terminal 301 for receiving the first phase difference $\theta_K$ from the first phase difference detector 103; a terminal 302 for receiving the second phase difference $\epsilon_K$ from the second phase difference detector 104; a delaying element 303 for delaying the first phase difference $\theta_K$ sample by sample; a multiplier 304 for multiplying the delayed phase difference $\theta_{K-i}$ and the filter coefficient from a delay circuit 308; and an adder 305 for adding the outputs of the multiplier 304 to generate a filter output. The filter 105 also has a filter coefficient updating circuit 310 consisting of a multiplier 306 for multiplying the second phase difference $\epsilon_K$ and the delayed phase difference $\theta_{K-i}$, an adder 307 for adding the output of the multiplier 306 and the filter coefficient from the delay circuit 308, and a filter coefficient memory 311 for storing a prescribed filter coefficient $C_i(O)$ and outputting its content in response to a clear signal Cl. The coefficient updating circuit 310 has a selecting circuit 309 for using the prescribed filter coefficient $C_i(O)$ in response to the clear signal Cl as the initial value in order to accelerate the convergence of the filter. The selector 309, in a normal state, selects the updated coefficient from the adder 306.

As an example of the initial value $C_i(O)$ of the filter coefficient, the coefficient represented by the following equation is used.

$$C_i(O) = A \cos(2\pi i f_n T)$$

where $A = \Sigma\{C_i^2(O)\}^{-1}$ $f_n$ is the most frequently appearing jitter frequency equal to the frequency of a commercial power source, and T is the sampling period.

Figure 4:
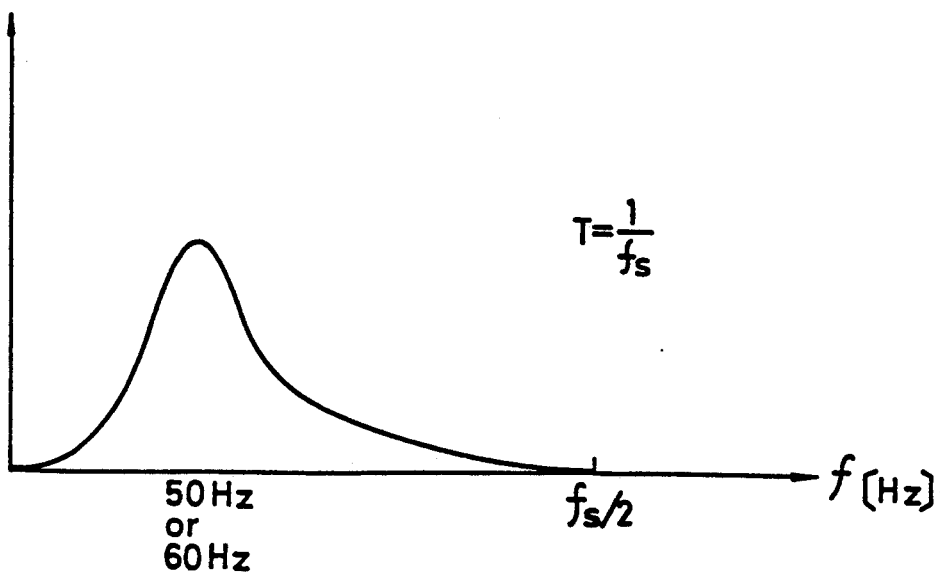
FIGS. 4 and 5 are diagrams showing typical frequency characteristics of a band-pass filter.

The coefficient $C_i(O)$ corresponds to an impulse response shown in FIG. 4, which is the time-regional expression of a frequency characteristic.

Figure 5:
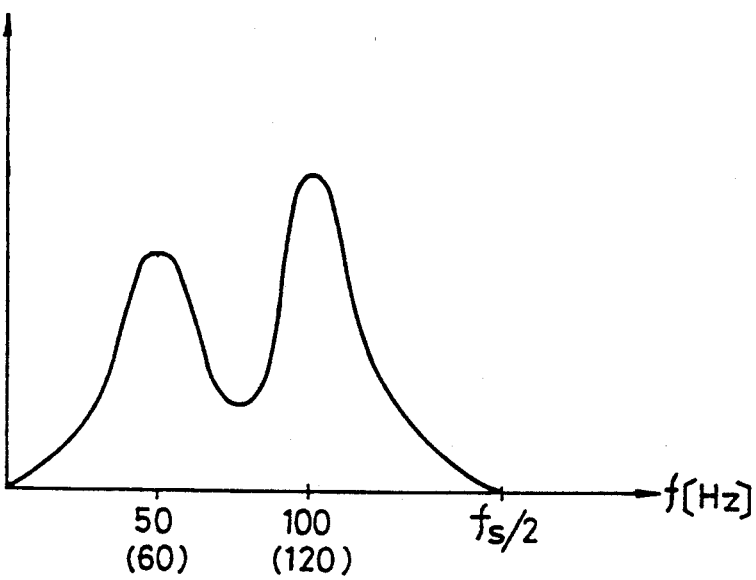

An impulse response shown in FIG. 5, which is the time-regional expression of frequency characteristic including the harmonic content of the power source frequency, may also be used as the initial value of the filter coefficient. In this case, not only the jitters of the power source frequency but also those corresponding to its harmonic content can be suppressed.

Now will be described how the filter coefficient is updated. Supposing that the tap coefficient of the adaptive filter 105 pertaining to the phase difference $\theta_K$ at a sampling time K is $C_i(K)$ $(i=1, 2, \ldots, N)$ (N is the number of taps), the output $\bar{\theta}_K$ of the filter 105 will be:

$$\bar{\theta}_k = \sum_{i=1}^{N} C_i(K) \cdot \theta_{k-i} \quad \text{Eq. (5)}$$

Meanwhile, a phase error signal $\epsilon_K$, which is the difference between the predicted phase $\bar{\theta}_K$ and the actual phase difference $\epsilon_K$, can be represented by:

$$\epsilon_k = \theta_k - \sum_{i=1}^{N} C_i(k) \cdot \theta_{k-i} \quad \text{Eq. (6)}$$

Calculated below, by using the maximum inclination method, is such a tap coefficient $C_i(K)$ which will minimize $\epsilon_K^2$.

Since $\epsilon_K^2$ is a convex downward function with respect to the tap coefficients $C_i$, $\epsilon_K^2$ will converge to its minimum value if the inclination of $\epsilon_K^2$ in an Nth order space at a tap coefficient of $C_i$ is calculated and the tap coefficient $C_i$ is so updated on that basis so as to reduce the inclination to zero.

$$\text{Inclination} = \frac{\partial E(\epsilon_k^2)}{\partial C_i(k)} \quad \text{Eq. (7)}$$

where $E(\epsilon_K^2)$ is the expected value of $\epsilon_K$.

If this calculation is done with $E(\epsilon_K^2)$ replaced with $(\epsilon_K^2)$, $$\text{Momentary inclination} = \frac{\partial(\epsilon_k^2)}{\partial C_i(k)} = 2\epsilon_k \frac{\partial \epsilon_k}{\partial C_i(k)} \quad \text{Eq. (8)}$$

If Eq. (6) is substituted into the Eq. (8), $$\text{Momentary inclination} = -2 \epsilon_K \theta_{k-i} \quad \text{Eq. (9)}$$

Therefore, Eq. (9) will become equivalent to Eq. (7) if the updating of the tap coefficient $C_i$ by multiplying the inclination represented by Eq. (9) by a modification coefficient $\alpha$ is repeated, and $E(\epsilon_K^2)$ will be converged to its minimum value. The modification coefficient $\alpha$ takes into account the constant $-2$ in Eq. (9).

Accordingly, the tap coefficient $C_i$ can be modified as follows.

$$C_i(k+1) = C_i(k) + \alpha\epsilon_k \theta_{k-i} \quad \text{Eq. (10)}$$

It is evident that the coefficient modification represented by this Eq. (10) is accomplished by the aforementioned delay element 308, adder 307 and multiplier 306.

As hitherto described, the present invention makes it possible to realize a rapidly converging jitter canceller by setting, before starting a data transmission, a prescribed filter coefficient into he filter as the filter's initial value.

What is claimed is:

1. A jitter canceller comprising:
   phase rotating means for supplying a phase-rotated received signal by rotating a received complex baseband signal by a prescribed phase;
   a decision circuit for discriminating a received symbol from said phase-rotated received signal and supplying a discriminated symbol;
   first phase detecting means for extracting a phase error between said discriminated signal and said received complex baseband signal and supplying a first phase error signal;
   second phase detecting means for extracting a phase error between said discriminated signal and said phase-rotated received signal and supplying a second phase error signal;
   and adaptive filter responsive to said first and second phase error signals for generating said prescribed phase; and
   coefficient setting means responsive to a clear signal supplied from outside for setting a prescribed filter coefficient as a tap coefficient of said adaptive filter.

2. A jitter canceller, as claimed in claim 1, wherein a value which will so determine the frequency characteristic of said adaptive filter as to pass only a single sine wave is used as said prescribed filter coefficient.

3. A method for jitter canceling comprising the following steps:
   supplying a phase-rotated received signal by rotating a received complex baseband signal by a prescribed phase;
   discriminating a received symbol from said phase-rotated received signal and supplying a discriminated symbol;
   extracting a first phase error between said discriminated signal and said received complex baseband signal and supplying a first phase error signal;
   extracting a second phase error between said discriminated signal and said phase-rotated received signal and supplying a second phase error signal;
   generating said prescribed phase from said first and second phase error signals using an adaptive filter; and
   responding to a clear signal supplied from outside by setting a prescribed filter coefficient as a tap coefficient of said adaptive filter.

4. A jitter canceller comprising:
   phase rotating circuit for supplying a phase-rotated received signal by rotating a received complex baseband signal by a prescribed phase;
   a decision circuit for discriminating a received symbol from said phase-rotated received signal and supplying a discriminated symbol;
   first phase difference detector for extracting a phase error between said discriminated signal and said received complex baseband signal and supplying a first phase error signal;
   second phase different detector for extracting a phase error between said discriminated signal and said phase-rotated received signal and supplying a second phase error signal;
   an adaptive filter responsive to said first and second phase error signals for generating said prescribed phase; and
   a coefficient updating circuit responsive to a clear signal supplied from outside for setting a prescribed filter coefficient as a tap coefficient of said adaptive filter.

* * * * *